(12) United States Patent
Kim et al.

(10) Patent No.: US 11,025,235 B2
(45) Date of Patent: Jun. 1, 2021

(54) LEVEL SHIFTER

(71) Applicant: SK hynix Inc., Gyeonggi-do (KR)

(72) Inventors: Sungwoo Kim, Gyeonggi-do (KR); Kwandong Kim, Chungcheongbuk-do (KR); Inhwa Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/843,971

(22) Filed: Apr. 9, 2020

(65) Prior Publication Data
US 2021/0044282 A1    Feb. 11, 2021

(30) Foreign Application Priority Data

Aug. 7, 2019    (KR) ........................ 10-2019-0096118

(51) Int. Cl.
*H03K 19/0185*    (2006.01)
*H03K 3/037*    (2006.01)
(52) U.S. Cl.
CPC ..... *H03K 3/037* (2013.01); *H03K 19/018521* (2013.01)

(58) Field of Classification Search
CPC ....... H03K 19/0175; H03K 19/017509; H03K 19/0185; H03K 19/018507; H03K 19/018521; H03K 3/037; G11C 7/1057; G11C 7/1084
See application file for complete search history.

(56) References Cited

U.S. PATENT DOCUMENTS

| | | | |
|---|---|---|---|
| 6,600,679 B2 | 7/2003 | Tanzawa et al. | |
| 9,331,516 B2* | 5/2016 | Goyal | ............. H03K 19/01707 |
| 9,571,085 B2* | 2/2017 | Waltener | ........ H03K 19/017509 |
| 10,044,347 B2 | 8/2018 | Abesingha et al. | |

\* cited by examiner

*Primary Examiner* — Long Nguyen
(74) *Attorney, Agent, or Firm* — IP & T Group LLP

(57) ABSTRACT

A level shifter includes: a first inverter suitable for inverting a signal of a first node based on a first pull-up voltage and a first pull-down voltage; a second inverter suitable for inverting the signal of the first node based on a second pull-up voltage and a second pull-down voltage; and a capacitor coupled between an output node of the first inverter and an output node of the second inverter.

6 Claims, 4 Drawing Sheets

LEVEL SHIFTER

CROSS-REFERENCE TO RELATED APPLICATIONS

The present application claims priority of Korean Patent Application No. 10-2019-0096118, filed on Aug. 7, 2019, which is incorporated herein by reference in its entirety.

BACKGROUND

1. Field

Various embodiments of the present invention relate to a level shifter.

2. Description of the Related Art

Circuits with diverse functions may be integrated in a single integrated circuit. The circuits may use different levels of power source voltages, which require an interface circuit that changes voltage levels of the signals transferred between the circuits. Such interface circuit is called a level shifter.

SUMMARY

Embodiments of the present invention are directed to a level shifter that may secure the quality of output signals thereof.

In accordance with an embodiment of the present invention, a level shifter includes: a first inverter suitable for inverting a signal of a first node based on a first pull-up voltage and a first pull-down voltage; a second inverter suitable for inverting the signal of the first node based on a second pull-up voltage and a second pull-down voltage; and a capacitor coupled between an output node of the first inverter and an output node of the second inverter.

DETAILED DESCRIPTION

Figure 1:
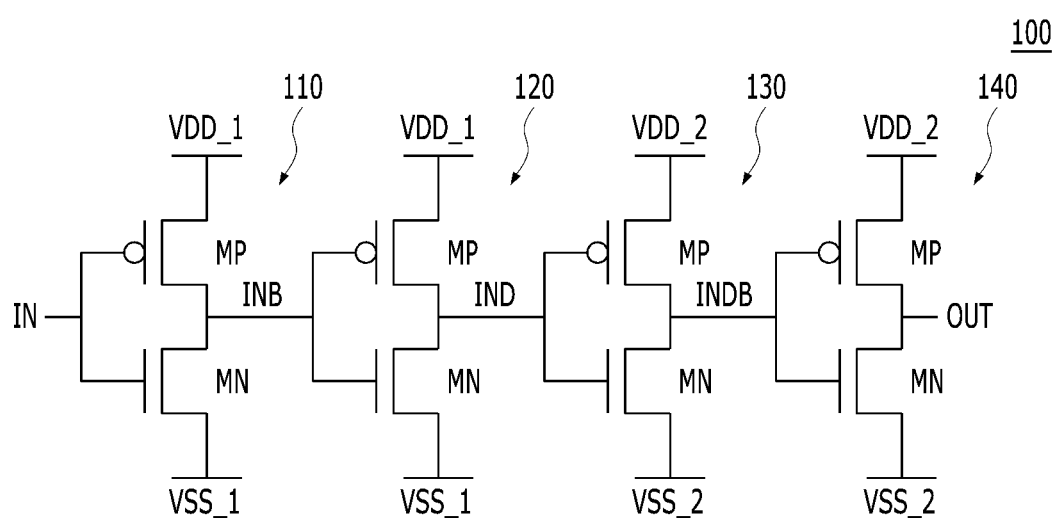
FIG. 1 is a diagram illustrating a level shifter in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well, unless the context clearly indicates otherwise. The articles 'a' and 'an' as used in this application and the appended claims should generally be construed to mean 'one or more' unless specified otherwise or clear from context to be directed to a singular form.

FIG. 1 is a diagram illustrating a level shifter 100 in accordance with an embodiment of the present invention.

Referring to FIG. 1, the level shifter 100 may include inverters 110 to 140 that are serially coupled.

The level shifter 100 may shift a swing level of an input signal IN that swings from a level of a first pull-down voltage VSS_1 to a level of a first pull-up voltage VDD_1, and generate an output signal OUT that swings from a level of a second pull-down voltage VSS_2 to a level of a second pull-up voltage VDD_2. The first pull-up voltage VDD_1 may have a level higher than the second pull-up voltage VDD_2. The first pull-down voltage VSS_1 and the second pull-down voltage VSS_2 may have the same level, or the first pull-down voltage VSS_1 and the second pull-down voltage VSS_2 may have different levels.

Each of the inverters 110 and 120 may invert a signal inputted thereto to output the inverted signal. The inverters 110 and 120 may operate based on the first pull-down voltage VSS_1 and the first pull-up voltage VDD_1. The input signal IN may be a signal that swings from the level of the first pull-down voltage VSS_1 to the level of the first pull-up voltage VDD_1. Since the signals INB and IND are output signals of the inverters 110 and 120, respectively, that operate based on the first pull-down voltage VSS_1 and the first pull-up voltage VDD_1, the signals INB and IND may also swing from the level of the first pull-down voltage VSS_1 to the level of the first pull-up voltage VDD_1.

Each of the inverters 130 and 140 may invert the signal inputted thereto. The inverters 130 and 140 may operate based on the second pull-down voltage VSS_2 and the second pull-up voltage VDD_2. Since the inverters 130 and 140 operate based on the second pull-down voltage VSS_2 and the second pull-up voltage VDD_2, signals INDB and OUT outputted from the inverters 130 and 140 may swing from the level of the second pull-down voltage VSS_2 to the level of the second pull-up voltage VDD_2.

The input signal IN may go through the inverters 110 to 140 to be outputted as the output signal OUT. Whereas the input signal IN swings from the level of the first pull-down voltage VSS_1 to the level of the first pull-up voltage VDD_1, the output signal OUT may swing from the level of the second pull-down voltage VSS_2 to the level of the second pull-up voltage VDD_2. Thus, the output signal OUT may be obtained by shifting the swing level of the input signal IN.

Each of the inverters 110 to 140 may include a PMOS transistor (e.g., MP) and an NMOS transistor (e.g., MN).

Since the inverters 110 to 130 receive signals that swing at a relatively higher voltage level at a gate, an equivalent oxide thickness (EOT) of PMOS transistors of the inverters 110 to 130 may be greater than an EOT of a PMOS transistor of the inverter 140. Also, EOTs of NMOS transistors of the inverters 110 to 130 may be greater than an EOT of an NMOS transistor of the inverter 140.

Herein, although it is illustrated that there are four serially coupled inverters 110 to 140 included in the level shifter 100, it is obvious to those skilled in the art that the number of the inverters may vary.

Figure 2:
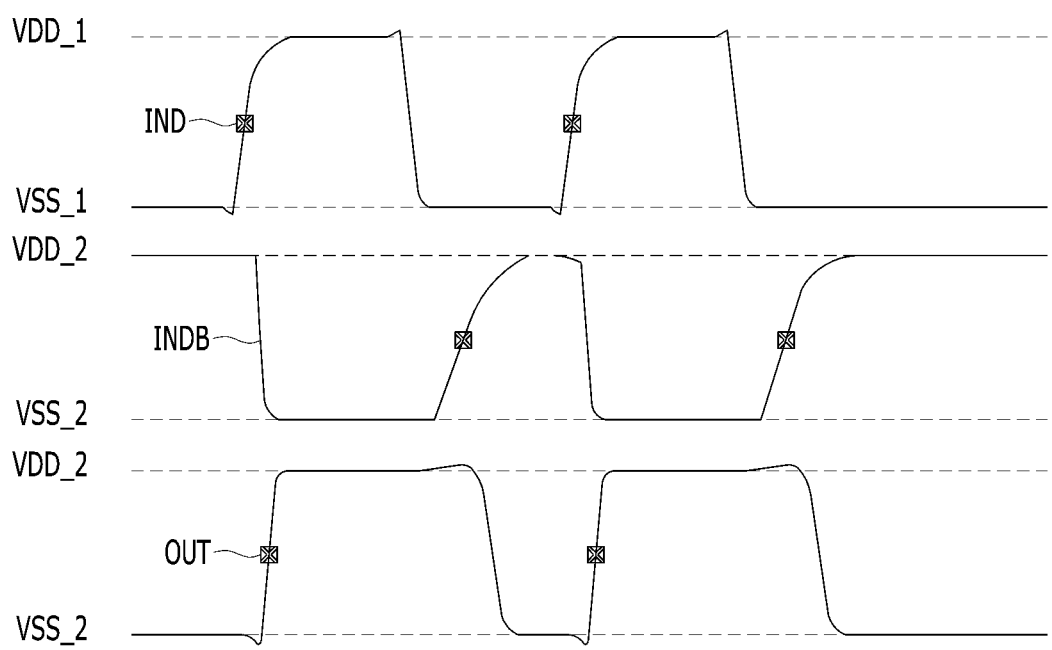
FIG. 2 is a timing diagram for describing an operation of the level shifter shown in FIG. 1.

FIG. 2 is a timing diagram for describing an operation of the level shifter 100 shown in FIG. 1. FIG. 1 shows wave forms of the signals IND, INDB, and OUT of the level shifter 100.

Referring to FIG. 2, when the signal IND transitions from a logic low level to a logic high level, it may be seen that the signal INDB transitions immediately from a logic high level to a logic low level. In other words, a rising of the signal IND is well reflected in a falling of the signal INDB.

However, when the signal IND transitions from a logic high level to a logic low level, it may be seen that it takes a long time for the signal INDB to transition from a logic low level to a logic high level. In other words, a falling of the signal IND is not reflected well in a rising of the signal INDB. This occurs because although the PMOS transistor and the NMOS transistor of the inverter 130 are designed to have a thick EOT, the level of the second pull-up voltage VDD_2, which is the pull-up voltage of the inverter 130, is lower than that of the first pull-up voltage VDD_1 so as to slow down pull-up driving the output signal INDB.

The phenomenon that the signal INDB hardly rises may be eventually reflected in the output signal OUT. As a result, time delay may scarcely occur between a rising of the input signal IN and a rising of the output signal OUT, but a large amount of time delay may occur between a falling of the input signal IN and a falling of the output signal OUT. This may cause a concern of a duty cycle error in which a width of a high pulse increases and a width of a low pulse decreases when a signal, such as a clock, passes through the level shifter 100.

Figure 3:
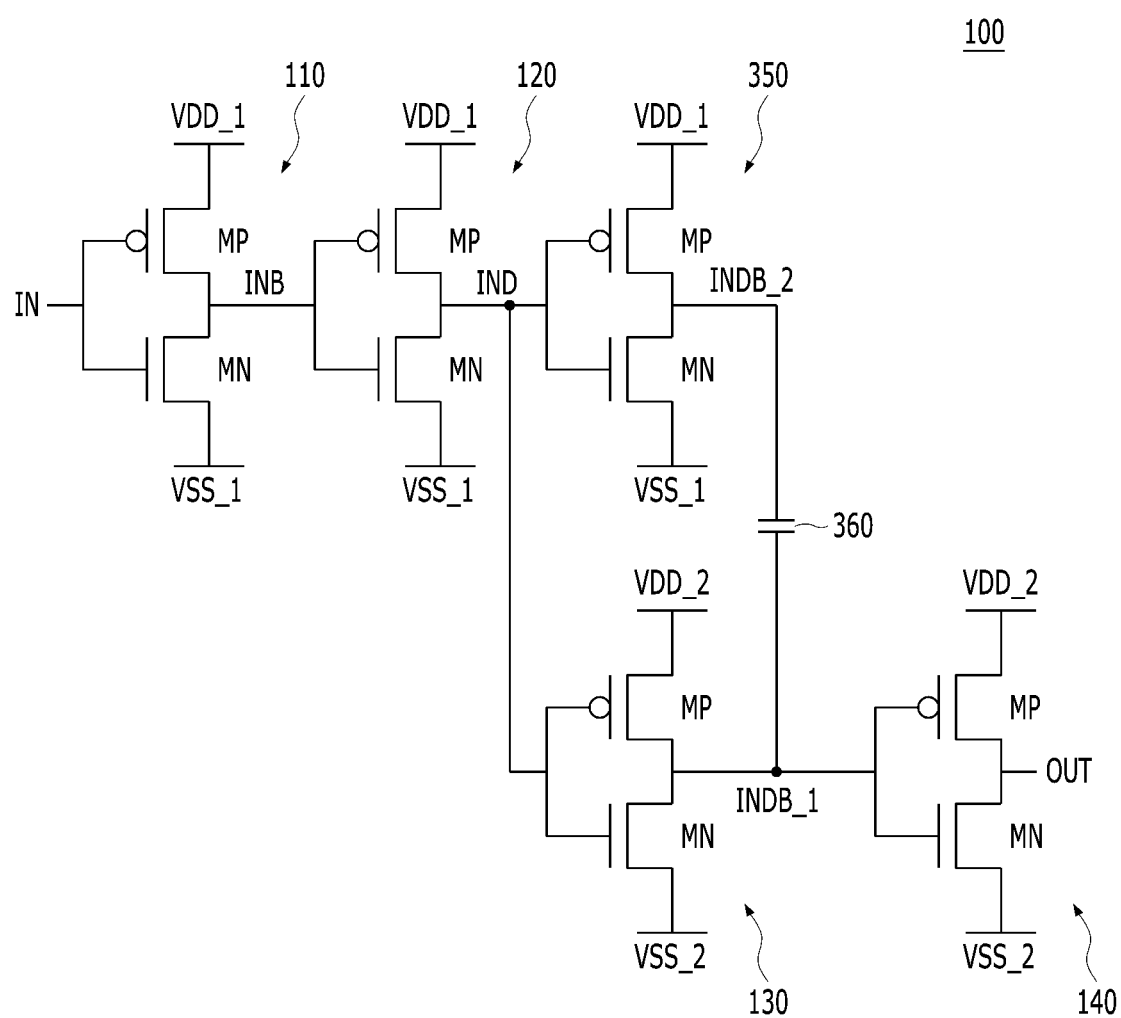
FIG. 3 is a diagram illustrating a level shifter in accordance with another embodiment of the present invention.

FIG. 3 is a diagram illustrating a level shifter 300 in accordance with another embodiment of the present invention.

Referring to FIG. 3, the level shifter 300 may include inverters 110 to 140 that are serially coupled just as the level shifter 100 of FIG. 1. The level shifter 300 may further include an inverter 350 and a capacitor 360.

The inverter 350 may invert the signal IND outputted from the inverter 120 and output the inverted signal INDB_2 based on the first pull-down voltage VSS_1 and the first pull-up voltage VDD_1. A PMOS transistor and an NMOS transistor of the inverter 350 may be formed to have EOTs as thick as the inverters 110 and 120. Further, the EOTs of the PMOS transistor and the NMOS transistor of the inverter 350 may be greater than that of the inverter 130. Since the inverter 350 operates based on the first pull-down voltage VSS_1 and the first pull-up voltage VDD_1, time delay may hardly occur for both rising and falling between the input signal IND and the output signal INDB_2 of the inverter 350.

The capacitor 360 may be coupled between an output node of the inverter 350 and an output node of the inverter 130. Since the capacitor 360 is coupled between the output node of the inverter 350 and the output node of the inverter 130, a rising of the signal INDB_2 may enhance a rising of the signal INDB_1 in the rising section of the signals INDB_1 and INDB_2. Also, since the output nodes of the inverters 130 and 350 are not directly coupled to each other but they are coupled through the capacitor 360, voltage levels of the output nodes of the inverters 130 and 350 may be different from each other. In other words, even though the signal INDB_2 of the output node of the inverter 350 swings from the level of the first pull-down voltage VSS_1 to the level of the first pull-up voltage VDD_1, the signal INDB_1 of the output node of the inverter 130 may swing from the level of the second pull-down voltage VSS_2 to the level of the second pull-down voltage VDD_2.

Figure 4:
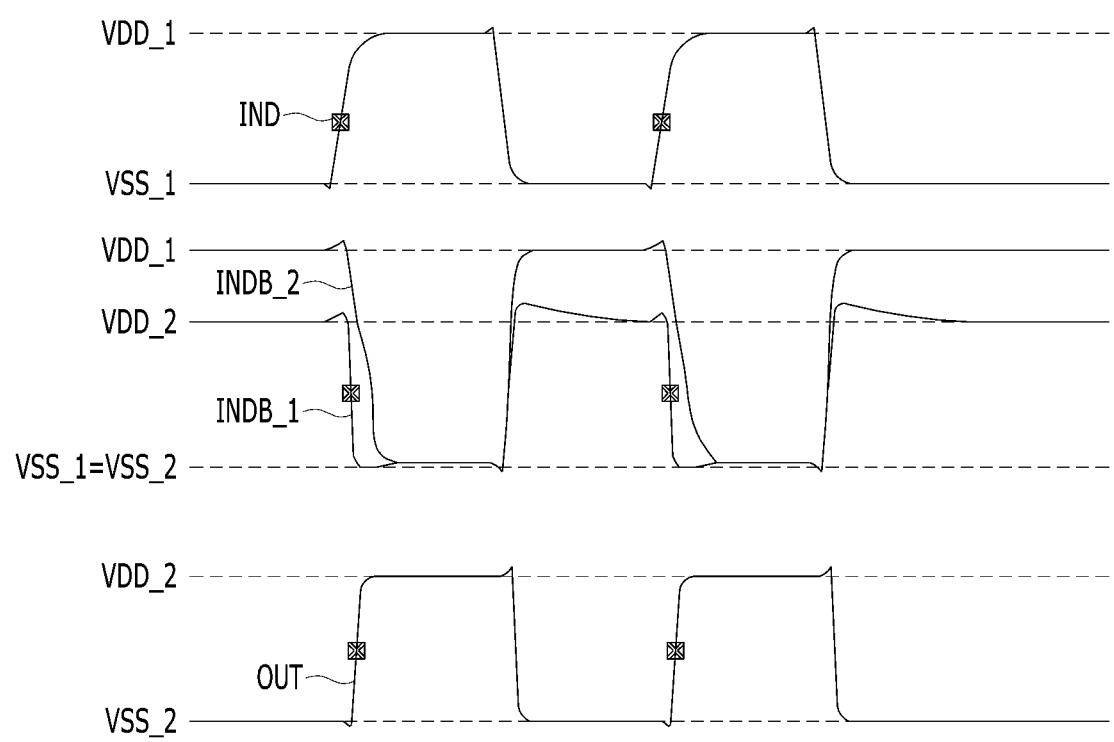
FIG. 4 is a timing diagram for describing an operation of the level shifter shown in FIG. 3.

FIG. 4 is a timing diagram for describing an operation of the level shifter 300 shown in FIG. 3. FIG. 3 shows wave forms of the signals IND, INDB_1, INDB_2, and OUT of the level shifter 300 shown in FIG. 3.

Referring to FIG. 4, it may be seen that a falling of the signal IND is reflected immediately in a rising of the signal INDB_2, and a rising of the signal IND is reflected immediately in a falling of the signal INDB_2.

Since the falling and rising of the signal INDB_2 enhances the falling and rising of the signal INDB_1 through the capacitor 360, the falling of the signal IND may be well reflected in the rising of the signal INDB_1, and the rising of the signal IND may be well reflected in the falling of the signal INDB_1. In other words, as shown in FIG. 2, it may be seen that the rising of the signal INDB_1 is not delayed.

Accordingly, time delay scarcely occurs between the falling and rising of the input signal IN and the falling and rising of the output signal OUT. In other words, even though a signal, such as a clock, passes through the level shifter 300, the duty cycle error may not occur.

According to the embodiments of the present invention, the quality of output signals of a level shifter may be increased.

While the present invention has been described with respect to the specific embodiments, it will be apparent to those skilled in the art that various changes and modifications may be made without departing from the spirit and scope of the invention as defined in the following claims.

What is claimed is:

1. A level shifter, comprising:
   a first inverter suitable for inverting a signal of a first node based on a first pull-up voltage and a first pull-down voltage;
   a second inverter suitable for inverting the signal of the first node based on a second pull-up voltage and a second pull-down voltage; and
   a capacitor coupled between an output node of the first inverter and an output node of the second inverter,
   wherein the first pull-up voltage has a higher voltage level than the second pull-up voltage, and the first pull-down voltage and the second pull-down voltage have the same voltage level.

2. The level shifter of claim 1, wherein the first inverter includes a first NMOS transistor and a first PMOS transistor, and
   the second inverter includes a second NMOS transistor and a second PMOS transistor, and
   wherein an equivalent oxide thickness (EOT) of the first NMOS transistor is greater than an EOT of the second NMOS transistor, and
   an EOT of the first PMOS transistor is greater than an EOT of the second PMOS transistor.

3. The level shifter of claim 1, further comprising:
a third inverter suitable for inverting a signal of the output node of the second inverter based on the second pull-up voltage and the second pull-down voltage.

4. A level shifter, comprising:
a series of first inverters suitable for receiving an input signal and operating based on a first pull-up voltage and a first pull-down voltage;
a series of second inverters suitable for receiving a signal of an input node of a last inverter of the first inverters and operating based on a second pull-up voltage and a second pull-down voltage; and
a capacitor coupled between an output node of the last inverter of the first inverters and an output node of a first inverter of the second inverters.

5. The level shifter of claim 4, wherein the first pull-up voltage has a voltage level higher than the second pull-up voltage.

6. A level shifter, comprising:
a first inverter suitable for inverting a signal of a first node based on a first pull-up voltage and a first pull-down voltage;
a second inverter suitable for inverting the signal of the first node based on a second pull-up voltage and a second pull-down voltage; and
a capacitor coupled between an output node of the first inverter and an output node of the second inverter,
wherein the first inverter includes a first NMOS transistor and a first PMOS transistor, and the second inverter includes a second NMOS transistor and a second PMOS transistor, and
wherein an equivalent oxide thickness (EOT) of the first NMOS transistor is greater than an EOT of the second NMOS transistor, and an EOT of the first PMOS transistor is greater than an EOT of the second PMOS transistor.

* * * * *